(12) United States Patent
Lai et al.

(10) Patent No.: US 8,388,195 B2
(45) Date of Patent: Mar. 5, 2013

(54) ILLUMINATION DEVICE WITH HEAT DISSIPATION STRUCTURES

(75) Inventors: Cheng-Tien Lai, Taipei Hsien (TW); Chi-Yuan Lai, Taipei Hsien (TW); Zhi-Yong Zhou, Shenzhen (CN)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 280 days.

(21) Appl. No.: 12/824,208

(22) Filed: Jun. 27, 2010

(65) Prior Publication Data

US 2011/0255285 A1 Oct. 20, 2011

(30) Foreign Application Priority Data

Apr. 14, 2010 (CN) .......................... 2010 1 0146693

(51) Int. Cl.
*B60Q 1/06* (2006.01)
*B60Q 1/26* (2006.01)
*F21V 29/00* (2006.01)

(52) U.S. Cl. ................... 362/373; 362/227; 362/249.01; 362/249.02

(58) Field of Classification Search ................ 362/373, 362/227, 249.01, 249.02
See application file for complete search history.

(56) References Cited

U.S. PATENT DOCUMENTS

| | | | |
|---|---|---|---|
| 2005/0178034 A1* | 8/2005 | Schubert et al. | 40/605 |
| 2007/0086188 A1* | 4/2007 | Raos et al. | 362/249 |
| 2009/0290346 A1* | 11/2009 | Ogawa et al. | 362/249.01 |

* cited by examiner

*Primary Examiner* — Karabi Guharay
*Assistant Examiner* — Zachary J Snyder
(74) *Attorney, Agent, or Firm* — Altis Law Group, Inc.

(57) ABSTRACT

An exemplary illumination device includes an enclosure, a semiconductor light source accommodated in the enclosure, and an envelope engaged with the enclosure and covering the semiconductor light source. Light generated by the semiconductor light source can project through the envelope and out of the illumination device. The semiconductor light source includes a plurality of light source modules independent from each other. A plurality of air passages are defined in each light source module for air passing therethrough to dissipate heat generated by the semiconductor light source into ambient air.

14 Claims, 6 Drawing Sheets

ILLUMINATION DEVICE WITH HEAT DISSIPATION STRUCTURES

BACKGROUND

1. Technical Field

The present disclosure relates generally to illumination devices, and more particularly to an illumination device for use with solid state light emitters, e.g., light emitting diodes (LEDs), which can have better heat dissipation.

2. Description of Related Art

LEDs as a source of illumination provide advantages such as resistance to shock and nearly limitless lifetime under specific conditions. Thus, illumination devices utilizing LEDs present a cost-effective yet high quality replacement for incandescent and fluorescent lamps.

With the increase of power and brightness of the LEDs, a lot of heat is generated during the work of the LEDs. The reliability of the LEDs would be impacted, if the heat is not adequately addressed. Thus, heat dissipation devices are usually applied in the illumination devices for cooling the LEDs. A typical heat dissipation device comprises a base and a plurality of fins extending on the base, which have a large heat dissipating area for promoting heat dissipation efficiency. The plurality of fins are nonetheless of large volume, resulting in increases of the volume and weight of the illumination device. Applying a fan or a heat pipe in the heat dissipation device is also attempted. However, they are of high cost, which is a disadvantage of popularization application.

What is needed therefore is an illumination device having heat dissipation structures which can overcome the above limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Figure 1:
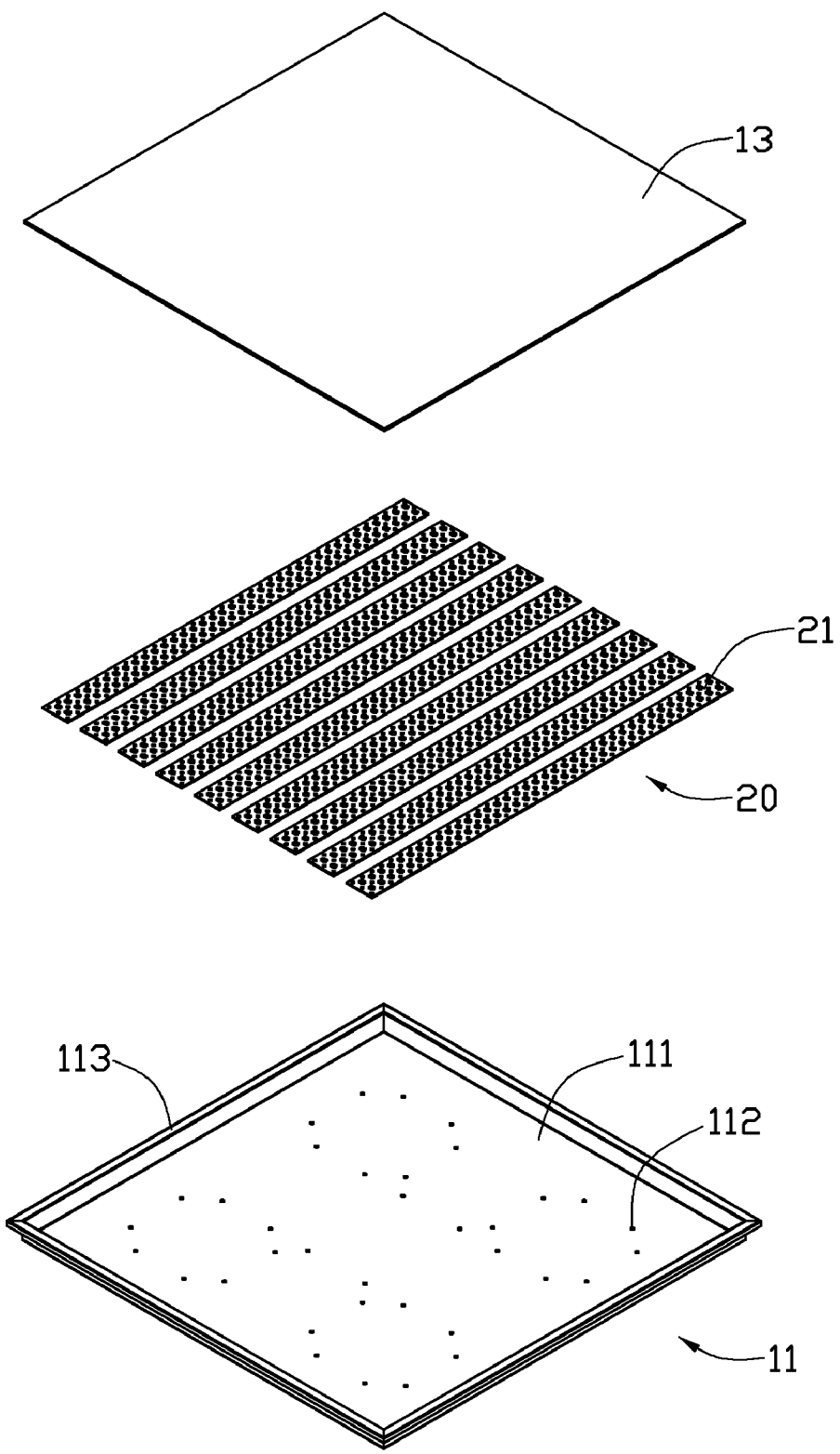
FIG. 1 is an isometric, exploded view of an illumination device in accordance with a first embodiment of the present disclosure.
Figure 2:
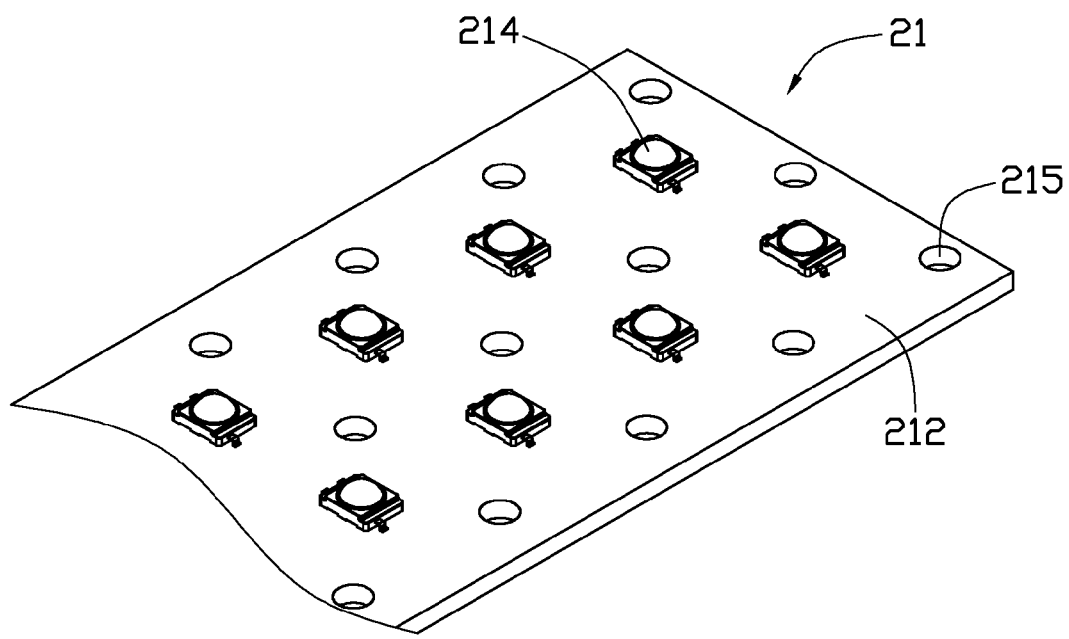
FIG. 2 is an enlarged view of a light source module of the illumination device in FIG. 1.

An illumination device of the present disclosure can be applied in an office, a hall or other indoor rooms for illumination or decoration. As shown in FIGS. 1-2, the illumination device in accordance with a first embodiment of the present disclosure comprises an enclosure 11, a semiconductor light source 20 accommodated in the enclosure 11 and an envelope 13 engaged with the enclosure 11 and covering the semiconductor light source 20. Light generated by the semiconductor light source 20 can project out of the illumination device from the envelope 13. The semiconductor light source 20 comprises a plurality of light source modules 21 independent from each other. If a singe light source module 21 needs to be replaced, other light source modules 21 would not be affected. A plurality of air passages (more details herebelow) are defined in each light source module 21 for air passing therethrough to dissipate heat of the light source module 21 into ambient air.

The enclosure 11 is made of a material with good heat conductivity such as metal. The enclosure 11 comprises a bottom base 111 and four lateral walls 113 extending upwardly from four edges of the bottom base 111. A plurality of securing pores 112 are defined in the bottom base 111. Fasteners (not shown) can be inserted in the pores 112 to secure the light source modules 21 in the enclosure 11. Additional pores 112 can also be defined in the bottom base 111 to be used as heat dissipation tunnels.

The envelope 13 is made of transparent or translucent material such as glass. The envelope 13 is engaged with the four lateral walls 113 to protect the light source modules 21.

Each light source module 21 comprises a board 212 and a plurality of semiconductor light emitting elements, such as LEDs 214, mounted on a top surface of the board 212. The board 212 is made of material with good heat conductivity such as metal or ceramic, and has a substantially rectangular shape. A bottom surface of the board 212 is attached to the enclosure 11. Heat generated by the LEDs 214 can be dissipated by the board 212, and further dissipated by the enclosure 11. In the present embodiment, a plurality of holes 215 are defined through the board 212, functioning as the air passages for air passing therethrough to further dissipate the heat generated by the LEDs 214 on the board 212. The holes 215 are easily formed, which helps achieving a low cost of the illumination device. The holes 215 are evenly defined in the board 212. It is noted that the holes 215 can be uneven in alternative embodiments, e.g., large density in a middle portion of the board 212 and small density in two ends of the board 212.

Understandably, the air passages defined in the light source modules 21 are not limited to the fashion of the holes 215 disclosed in the previous embodiment. Different fashions of the air passages in alternative embodiments are illustrated below.

Figure 3:
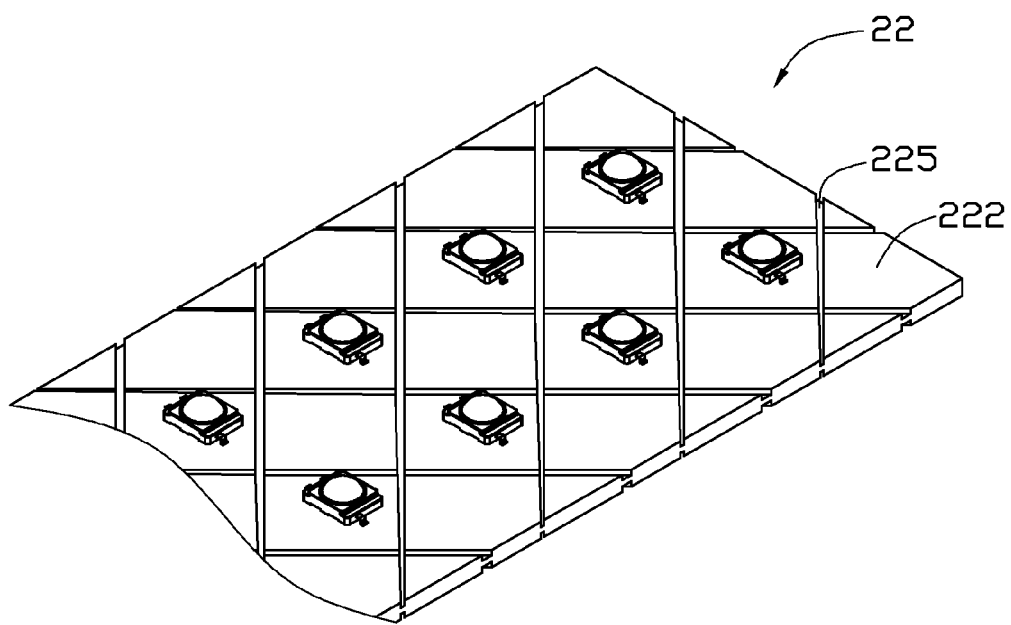
FIG. 3 is an enlarged view of a light source module of an illumination device in accordance with a second embodiment of the present disclosure.

Referring to FIG. 3, a light source module 22 of an illumination device in accordance with a second embodiment of the present disclosure comprises a board 222 with a plurality of grooves 225 defined therein. The grooves 225 are configured to function as the air passages for air passing therethrough to further dissipate the heat generated by the LEDs 214 on the board 222. In this embodiment, the grooves 225 are defined in both top and bottom surfaces of the board 222. One single groove 225 in the top surface of the board 222 corresponds to one single groove 225 in the bottom surface of the board 222. The grooves 225 can also be selectively defined in the top surface or the bottom surface of the board 222. The grooves 225 on the top or the bottom surface of the board 222 comprise two groups running across with each other and both oriented at oblique angles with respect to a longitudinal direction of the board 222. Each groove 225 extends straightly and increases in width gradually from one end to the other, which is of advantage to circulation of the airflow. The formation of the grooves 225 can also increase a surface area of the board 222, which is an advantage of heat dissipation.

Figure 4:
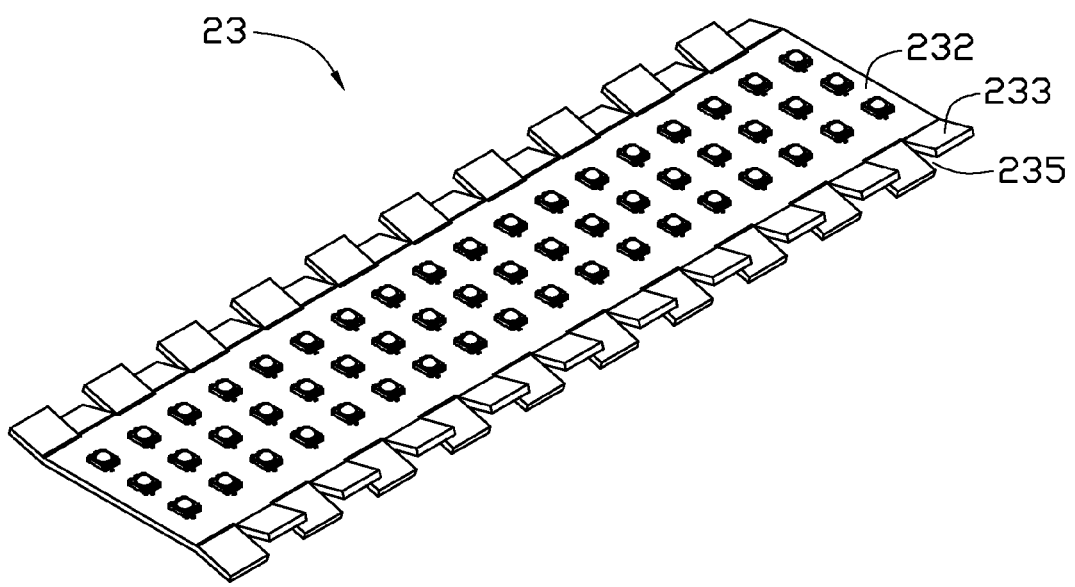
FIG. 4 is an enlarged view of a light source module of an illumination device in accordance with a third embodiment of the present disclosure.

Referring to FIG. 4, a light source module 23 of an illumination device in accordance with a third embodiment of the present disclosure comprises a board 232 and a plurality of flakes 233 extending from edges of the board 232 towards different directions, with a plurality of gaps 235 defined between the flakes 233. The gaps 235 are configured to function as the air passages for air passing therethrough to further dissipate the heat generated by the LEDs 214 on the board 232. In this embodiment, the gaps 235 are defined in two long edges of the board 232. Understandably, the gaps 235 can be defined in other positions such as two short edges of the board 232.

Figure 5:
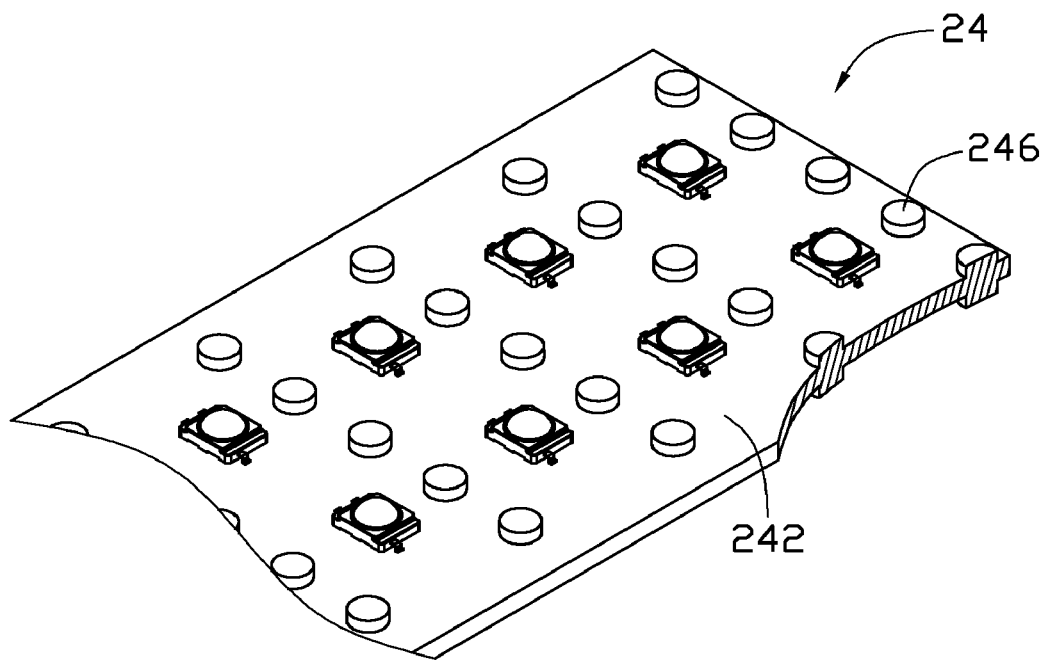
FIG. 5 is an enlarged view of a light source module of an illumination device in accordance with a fourth embodiment of the present disclosure.

More heat dissipation structures can be formed on the light source module. Referring to FIG. 5, a light source module 24 of an illumination device in accordance with a fourth embodiment of the present disclosure comprises a board 242 and a plurality of bulges 246 regularly formed on top and bottom surfaces of the board 242. A single bulge 246 on the top surface corresponds to a single bulge 246 on the bottom surface. The bulges 246 are of identical height. Forming the bulges 246 on the surfaces of the board 242 can increase a surface area of the board 242, which is an advantage of heat dissipation. Understandably, the bulges 246 can also be arranged irregularly, selectively in the top surface or the bottom surface, and formed with different heights in alternative embodiments.

Figure 6:
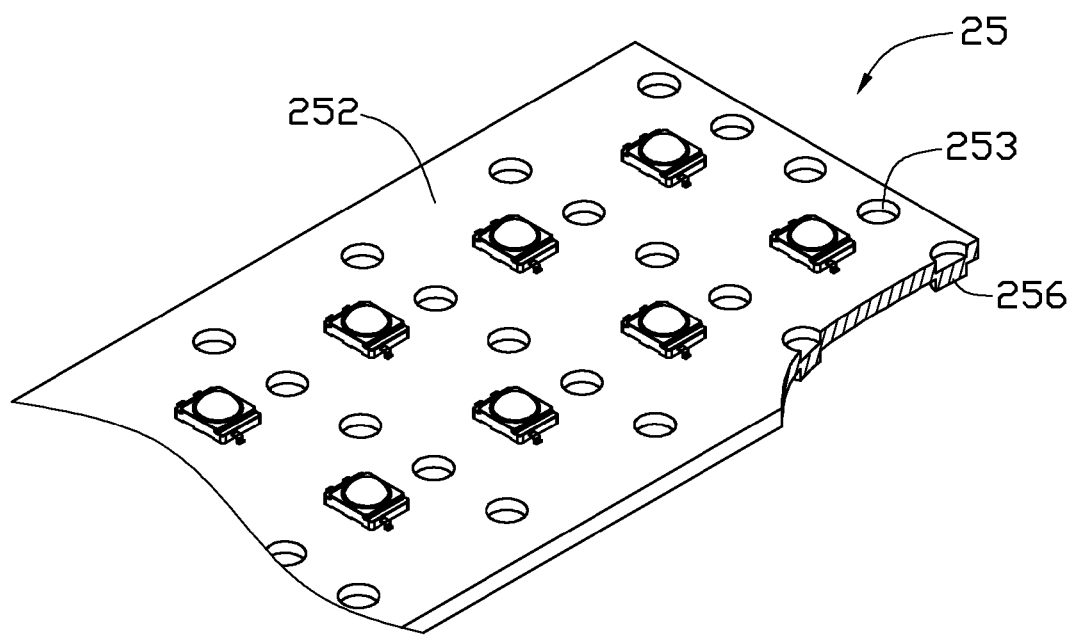
FIG. 6 is an enlarged view of a light source module of an illumination device in accordance with a fifth embodiment of the present disclosure.

Referring to FIG. 6, a light source module 25 of an illumination device in accordance with a fifth embodiment of the present disclosure comprises a board 252 with a plurality of recesses 253 defined in a top surface of the board 252, and a plurality of bulges 256 formed on a bottom surface of the board 252, to increase a surface area of the board 252. One single recess 253 in the top surface of the board 252 corresponds to one single bulge 256 on the bottom surface of the board 252. The recesses 253 and the bulges 256 are arranged regularly. Understandably, the recesses 253 and the bulges 256 can also be arranged irregularly, and formed with different depths and heights in alternative embodiments. Further, the recesses 253 and the bulges 256 can also be formed together in the top surface or in the bottom surface.

It is noted that, the features in each of the previous embodiments can be combined into a single embodiment. For example, the grooves 225 in the second embodiment can be defined at the same time in the board 212 of the first embodiment, which already have holes 215 therein; furthermore, the gaps 235 in the third embodiment can also be defined in edges of the board 212 of the first embodiment; moreover, the recesses 253 and/or the bulges 256 can also be formed on the surfaces of the board 212 of the first embodiment.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An illumination device comprising:
    an enclosure;
    a semiconductor light source accommodated in the enclosure and comprising a plurality of light source modules independent from each other, a plurality of air passages being defined in each light source module for air passing therethrough to dissipate heat generated by the semiconductor light source into ambient air; and
    an envelope engaged with the enclosure and covering the semiconductor light source, light generated by the semiconductor light source projecting through the envelope out of the illumination device;
    wherein the each light source module comprises a board and a plurality of light emitting diodes mounted on the board; and
    wherein a plurality of flakes extend outwardly from a periphery of the board towards different directions to define a plurality of gaps between the flakes, the gaps being positioned at the periphery of the board and being configured to function as the air passages.

2. The illumination device of claim 1, wherein a plurality of holes are defined in the board and also configured to function as the air passages.

3. The illumination device of claim 1, wherein a plurality of grooves are defined in at least one surface of the board and also configured to function as the air passages.

4. The illumination device of claim 3, wherein the grooves are defined in top and bottom surfaces of the board, and one single groove in the top surface corresponding to one single groove in the bottom surface.

5. The illumination device of claim 3, wherein the grooves comprise two groups running across with each other.

6. The illumination device of claim 3, wherein the grooves each extend straightly and increase in width gradually from one end to another.

7. The illumination device of claim 1, wherein a plurality of recesses are defined in at least one surface of the board.

8. The illumination device of claim 1, wherein a plurality of bulges are formed on at least one surface of the board.

9. The illumination device of claim 1, wherein a plurality of recesses are defined in one surface of the board, and a plurality of bulges are formed on another surface of the board.

10. An illumination device comprising:
    an enclosure;
    a plurality of light source modules accommodated in the enclosure, each light source module comprising a board and a plurality of light emitting diodes mounted on the board, a plurality of flakes extending outwardly from a periphery of the board towards different directions to define a plurality of gaps between the flakes, the gaps being positioned at the periphery of the board and being configured to function as air passages for air passing therethrough to dissipate heat generated by the light emitting diodes into ambient air; and
    an envelope engaged with the enclosure and covering the light source modules, light generated by the light source modules projecting through the envelope out of the illumination device.

11. The illumination device of claim 10, wherein a plurality of holes are defined in the board, and a plurality of grooves are defined in at least one surface of the board, wherein the holes and the grooves also function as the air passages for air passing therethrough to dissipate heat generated by the light emitting diodes into ambient air.

12. The illumination device of claim 10, wherein a plurality of recesses are defined in at least one surface of the board.

13. The illumination device of claim 10, wherein a plurality of bulges are formed on at least one surface of the board.

14. The illumination device of claim 10, wherein a plurality of recesses and bulges are formed on at least one surface of the board.

* * * * *